United States Patent
Spikes et al.

[11] Patent Number: 5,981,354
[45] Date of Patent: Nov. 9, 1999

[54] SEMICONDUCTOR FABRICATION EMPLOYING A FLOWABLE OXIDE TO ENHANCE PLANARIZATION IN A SHALLOW TRENCH ISOLATION PROCESS

[75] Inventors: Thomas E. Spikes; Fred N. Hause; Daniel Kadosh, all of Austin, Tex.

[73] Assignee: Advanced Micro Devices, Inc., Sunnyvale, Calif.

[21] Appl. No.: 08/820,417

[22] Filed: Mar. 12, 1997

[51] Int. Cl.$^6$ ............................................. H01L 21/463
[52] U.S. Cl. ..................... 438/424; 438/759; 438/760; 438/763; 438/782
[58] Field of Search ................................... 438/424, 626, 438/631, 760, 697, 698, 699, 700, 782, 763, 781, 780, 759

[56] References Cited

U.S. PATENT DOCUMENTS

| | | | |
|---|---|---|---|
| 4,307,180 | 12/1981 | Pogge | 430/314 |
| 4,506,434 | 3/1985 | Ogawa et al. | 29/571 |
| 4,756,977 | 7/1988 | Haluska et al. | 428/704 |
| 4,836,885 | 6/1989 | Breiten et al. | 156/643 |
| 4,849,370 | 7/1989 | Spratt et al. | 438/71 |
| 4,876,223 | 10/1989 | Yoda et al. | 438/228 |
| 5,516,729 | 5/1996 | Dawson et al. | 438/623 |
| 5,530,293 | 6/1996 | Cohen et al. | 257/752 |
| 5,536,675 | 7/1996 | Bohr | 438/67 |
| 5,548,159 | 8/1996 | Jeng | 257/634 |
| 5,656,555 | 8/1997 | Cho | 438/760 |
| 5,795,810 | 8/1998 | Houston | 438/404 |
| 5,814,549 | 9/1998 | Wu | 438/398 |
| 5,821,162 | 10/1998 | Yamaha et al. | 438/623 |

OTHER PUBLICATIONS

Jeng, et al., "Highly Porous Interlayer Dielectric For Interconnect Capacitance Reduction", Semiconductor Process and Device Center, Texas Instruments, Inc., Dallas, TX, pp. 1–2.

Ahlburn, et al., "Hydrogen Silsequioxane–Based Flowable Oxide as an Element in the Interlevel Dielectric for Sub 0.5 Micron ULSI Circuits", Texas Instruments, Inc., Dallas, TX, pp. 1–7.

*Primary Examiner*—Donald L. Monin, Jr.
*Assistant Examiner*—Kurt Eaton
*Attorney, Agent, or Firm*—Kevin L. Daffer; Conley, Rose & Tayon

[57] ABSTRACT

An improved planarization process for a trench dielectric is presented. A shallow trench isolation structure is formed into the semiconductor substrate. A thin oxide layer is grown upon the trench floor and upon the trench sidewalls, and then a trench dielectric, preferably TEOS deposited using a chemical-vapor deposition CVD process, is deposited into the trench dielectric and upon the semiconductor substrate. The upper surface of the trench dielectric conforms to the underlying contour defined by the shallow trench and the semiconductor substrate. Subsequent device formation requires a substantially planar semiconductor. Conventionally, a combination of masking and etching are used, prior to chemical-mechanical polishing ("CMP"), to aid the planarization process. The extra steps add cost and unnecessary complexity to the process. An alternative planarization process is proposed which uses hydrogen silsequioxane-based flowable oxide ("HSQ"). The HSQ is spin-on deposited upon the conformal trench dielectric in liquid form. After deposition the HSQ is heated which causes it to reflow and produce a substantially planar upper surface. The reflow parameters (such as temperature and time) are chosen so that the HSQ has a polish rate which is approximately equal to the polish rate of the trench dielectric. A chemical-mechanical polish ("CMP") is then used to entirely remove the HSQ layer and a portion of the trench dielectric exterior to the shallow trenches. Since the HSQ is polished at the same rate as the trench dielectric, the upper surface of the trench dielectric after the polish is substantially planar and approximately at the same level as the upper surface of the semiconductor substrate.

11 Claims, 3 Drawing Sheets

SEMICONDUCTOR FABRICATION EMPLOYING A FLOWABLE OXIDE TO ENHANCE PLANARIZATION IN A SHALLOW TRENCH ISOLATION PROCESS

BACKGROUND OF THE INVENTION

1. Field of the Invention

This invention relates to the field of semiconductor processing and, more particularly, to an improved method of planarizing a shallow trench dielectric using a combination of a spin-on deposited flowable oxide and a chemical-mechanical polish.

2. Description of Relevant Art

The fabrication of an integrated circuit involves placing numerous devices on a single semiconductor substrate. Isolation structures are needed to electrically isolate one device from another. Isolation structures define the field regions of the semiconductor substrate and the device areas define the active regions. The devices are interconnected with conducting lines running over the isolation structures.

A popular isolation technology used in integrated circuits involves the process of locally oxidizing silicon. Local oxidation of silicon, or LOCOS process, involves oxidizing field regions between device active regions. The oxide grown in field regions is termed field oxide. Field oxide is grown during the initial stages of integrated circuit fabrication before the gate conductor and source/drain regions are formed in active areas. By growing a thick field oxide in isolation (or field) regions pre-implanted with a channel-stop dopant, LOCOS processing serves to prevent the establishment of parasitic channels in the field regions.

While LOCOS has remained a popular isolation technology, there are several problems inherent to LOCOS. First, a growing field oxide extends entirely across the field region and laterally as a bird's-beak structure. In many instances, the bird's-beak structure can unacceptably encroach into the device active area. Second, the pre-implanted channel-stop dopant often redistributes during the high temperatures associated with field oxide growth. Redistribution of channel-stop dopant primarily affects the active area periphery causing problems known as narrow-width effects. Third, the thickness of field oxide causes large elevational disparities across the semiconductor topography between field and active regions. Topological disparities cause planarity problems which become severe as circuit critical dimensions shrink. Lastly, thermal oxide growth is significantly thinner in small field (i.e., field areas of small lateral dimension) regions relative to large field regions. In small field regions, a phenomenon known as field-oxide-thinning effect may therefore occur.

Many of the problems associated with LOCOS technology are alleviated by an isolation technique known as shallow trench isolation ("STI"). Despite advances made to decrease bird's-beak, channel-stop encroachment and non-planarity, it appears that LOCOS technology is still inadequate for deep submicron technologies. The shallow trench process, herein "trench process", is better suited for isolating densely spaced active devices having field regions less than, e.g., 3.0–5.0 μm in the lateral dimension. Narrow width STIs may be used to isolate densely spaced devices and larger width STIs may be used to isolate devices that are spaced further apart.

The trench process involves the steps of etching a silicon substrate surface to a relatively shallow depth, e.g., between 0.2 to 0.5 microns, and then filling the shallow trench with a deposited dielectric (referred to henceforth as "trench dielectric"). Some trench processes include an interim step of growing oxide on the trench walls prior to filling the trench with the dielectric. The trench dielectric may comprise decomposed tetra-ethyl-ortho-silicate ("TEOS") deposited using a chemical-vapor deposition ("CVD") process. CVD may, for example, be performed at approximately 400–600° C. in an atmospheric pressure or low pressure chamber.

An exemplary STI structure is shown in FIG. 1. Semiconductor substrate 10 is shown having STI-associated trenches 12 and 14 placed therein. Deposited trench dielectric 16 conforms to the contour of the underlying structure defined by shallow trenches 12 and 14. As a result, upper surface 18 of trench dielectric 16 is lower in the field regions above trench isolation areas compared to the active regions. Furthermore, upper surface 18 is lower over large-width shallow trench 12 compared to upper surface 18 over small-width shallow trench 14. Subsequent device formation requires a substantially planar semiconductor topography. The various depositions and patterning associated with device formation are more easily and more accurately accomplished on a pre-existing planar surface. Loss of planarity can impact manufacturing yield. Exemplary problems include poor adhesion to underlying materials, step coverage problems, and depth of focus problems. A polishing step is thus required, prior to any device formation, to planarize the upper surface of trench dielectric 18 and bring it to a level approximately equal to the level of the upper surface of the semiconductor substrate. However, applying the polishing step at this point in the process would result in upper surface 18 over large-width shallow trench 12 to be below upper surface 20 of semiconductor substrate 10. To avoid this, an additional masking and etching step is generally required.

Referring now to FIG. 2, photoresist layer 22 is deposited upon the semiconductor substrate and then patterned in such a way as to cover trench dielectric 16 over large-width shallow trench 12. The remaining exposed portion of trench dielectric 16 is then etched using an anisotropic plasma etch. Trench dielectric 16 is etched to a level approximately equal to or lower than the level of upper surface 18 of trench dielectric 16 above large-width shallow trench 12. Isolated protrusions 24 and 26 remain extending upwards from the remainder of upper surface 18. After the etch process, photoresist 22 is removed and a chemical-mechanical polish ("CMP") is applied to the wafer as shown in FIG. 3. A CMP process combines a mechanical polishing pad with chemical abrasion. Raised areas contact the polishing pad to a greater extent than recessed areas. As a result, elevated features, like protrusions 24 and 26, are removed faster without correspondingly thinning flat areas. CMP is typically a "dirty" procedure mainly due to the slurry particles used during the process. After the CMP process, upper surface 18 of trench dielectric 16 is substantially planar.

The additional masking and etching steps are costly and decrease overall throughput. Furthermore, these extra processing steps add unnecessary complexity to the process increasing the possibility of error and contamination. It would thus be desirable to derive an alternative process which eliminates the need for the additional masking and etching steps in order to achieve substantially global planarization.

SUMMARY OF THE INVENTION

The problems identified above are in large part addressed by an improved trench dielectric planarization process which eliminates the costly, additional masking and etching steps. After deposition of the trench dielectric, a layer of flowable oxide is spin-on deposited upon the upper surface of the trench dielectric. The flowable oxide is then heated to reflow and become substantially planar.

In a preferred embodiment, the flowable oxide comprises hydrogen silsesquioxane-based oxide ("HSQ"). HSQ has the general composition $(H_2Si_2O_3)_n$, where n is a number from 3 to 8. It has been shown that HSQ can fill gaps like trenches better than other spin-on dielectrics which makes it an ideal candidate for semiconductor circuits with critical dimensions less than 0.35 $\mu$m. HSQ can even fill irregularly shaped gaps with minimum dimensions of approximately 0.08 $\mu$m and aspect ratios (fill height-to-area) greater than 4. In addition, depending on the temperature used to cure the dielectric, the dielectric constant can be controlled to be anywhere in the range 2.9 to 3.1. Furthermore, curing the dielectric at different temperatures can produce a flowable oxide having a polish rate which is approximately equal to the underlying trench dielectric. The whole semiconductor topography combination (trench dielectric and overlying flowable oxide) is then polished at equivalent rates using CMP. Since the upper surface of the flowable oxide is now substantially planar and the flowable oxide has a polishing rate which is approximately equal to the polishing rate of the trench dielectric, the CMP produces a substantially planar surface.

The present invention incorporates the step of spin-on depositing the HSQ flowable oxide which eliminates the need for the additional masking and etching steps. Furthermore, it is postulated that the present process results in an upper surface for the trench dielectric which is more planar than that accomplished by prior planarization techniques. The overall production costs are reduced with the elimination of extra steps.

Broadly speaking, the present invention contemplates a method for planarizing a trench dielectric. A polish-stop layer is first formed upon a semiconductor substrate. The polish-stop layer may be a composite layer comprising a thermally grown oxide layer upon which a nitride layer is deposited. The oxide layer is used to protect the silicon from the deposited nitride. Sometimes referred to as a pad oxide or buffer oxide, the oxide cushions the transition of stresses between the silicon substrate and the overlying nitride layer. The nitride layer provides a polish stop during subsequent polishing of the wafer. At least one shallow trench is then formed in a region of the semiconductor substrate. The trench is formed by a photoresist layer which is deposited and then patterned using a mask to expose a would-be trench region of the upper surface of the semiconductor substrate. An anisotropic etch is then performed to remove part of the exposed semiconductor substrate and form the trench. A thin layer of thermal oxide is grown upon the trench floor and the trench sidewalls, and then the trench is filled by a trench dielectric, preferably TEOS deposited using a CVD method. The upper surface of the trench dielectric conforms to the underlying contour of the shallow trench. The upper surface of the trench dielectric is lower over the trench compared to the upper surface of the trench dielectric elsewhere and everywhere above the upper surface of the semiconductor substrate.

A sacrificial dielectric is then deposited upon the trench dielectric. The dielectric material is preferably hydrogen silsesquioxane-based flowable oxide ("HSQ"). HSQ is spin-on deposited in liquid form and then reheated to flow. As a result, the upper surface of the sacrificial dielectric is now substantially planar. The HSQ is cured at a particular temperature so as to have a polishing rate which is approximately the same as the polishing rate of the trench dielectric. The entirety of the sacrificial dielectric together with a portion of the underlying trench dielectric is then removed using a CMP process. A chemical-mechanical polish is preferably used which combines a mechanical pad in combination with chemical abrasion. The polishing process stops when it reaches the nitride polish-stop layer. The upper surface of the trench dielectric is now at the same level as the upper surface of the etch-stop. Since the sacrificial dielectric has approximately the same polish rate as the trench dielectric, the trench dielectric retains the initial planar upper surface as prior to CMP.

BRIEF DESCRIPTION OF THE DRAWINGS

Other objects and advantages of the invention will become apparent upon reading the following detailed description and upon reference to the accompanying drawings in which.

Figure 1:
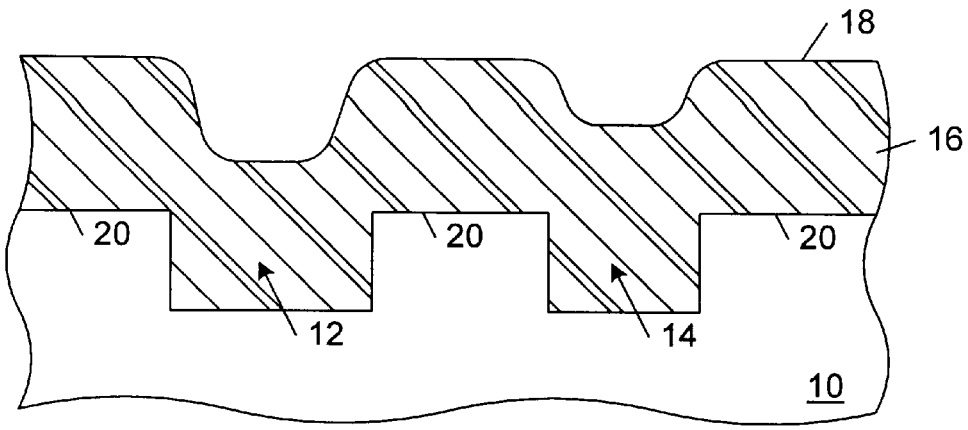
FIG. 1 is a partial cross-sectional view of a semiconductor topography showing the first step in a conventional trench planarization process, wherein the trench dielectric is deposited into the shallow trenches and upon the semiconductor topography.
Figure 2:
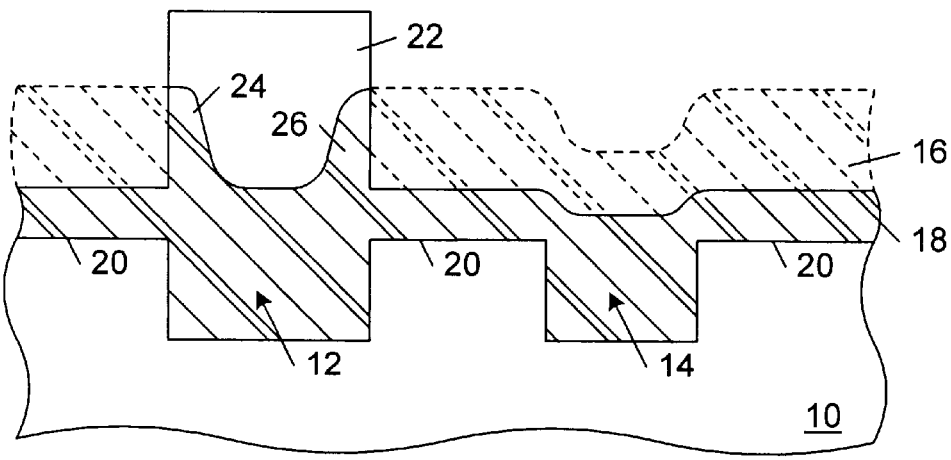
FIG. 2 is a partial cross-sectional view of a semiconductor topography according to a processing step subsequent to FIG. 1 showing the formation of a photoresist layer upon the large-width shallow trench and then partially etching the trench dielectric.
Figure 3:
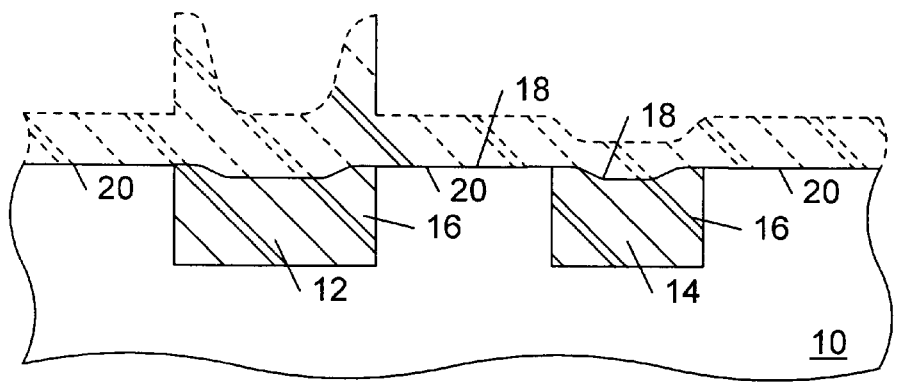
FIG. 3 is a partial cross-sectional view of a semiconductor topography according to a processing step subsequent to FIG. 2 showing polishing of the trench dielectric exterior to the shallow trenches, wherein the upper surface of the trench dielectric is approximately at the same level as the upper surface of the semiconductor substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 4:
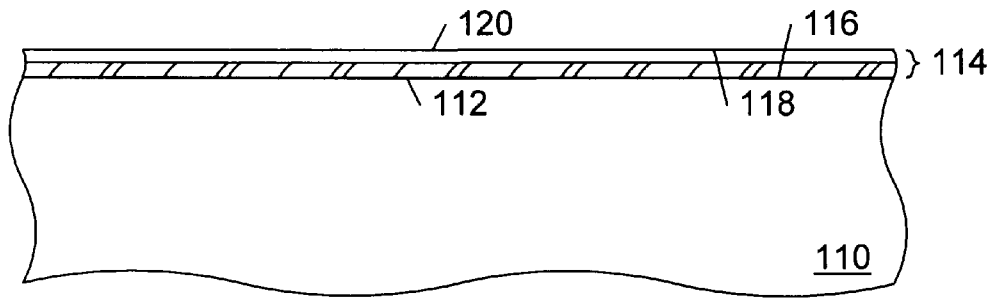
FIG. 4 is a partial cross-sectional view of a semiconductor topography showing a composite polish-stop layer, comprising a layer of oxide and a layer of nitride, formed upon a semiconductor substrate.

Turning now to the drawings, FIG. 4 shows a partial cross-sectional view of semiconductor substrate 110 and upper surface 112 of semiconductor substrate 110. Semiconductor substrate 110 preferably comprises lightly doped n-type or p-type single-crystalline silicon having a resistivity of, e.g., approximately 12 ohms-cm. Polish-stop layer 114 is then formed upon upper surface 112 of semiconductor substrate 110. In a preferred embodiment, polish-stop layer 114 is a composite layer comprising oxide layer 116 and nitride layer 118. Oxide layer 116 is preferably grown in a thermal oxidation furnace using temperatures of approximately 700–900° C. for a relatively short (e.g., less than 20 minutes) time. Oxide layer 116 may be grown to a thickness of approximately 15–600 Å. Nitride layer 118 is then deposited upon oxide layer 116, preferably using chemical-vapor deposition ("CVD"). The function of oxide layer 116, called pad or buffer oxide, is to cushion the transition of stresses between silicon substrate 110 and overlying nitride layer 118. In general, the thicker the oxide, the less edge force is transmitted to the silicon from the nitride. Usually, the minimum oxide thickness that will avoid the formation of dislocations is used. Nitride has dissimilar polish characteristics compared to subsequently deposited CVD oxide and is thus a good polish-stop layer. In addition, the nitride layer protects the upper surface of silicon substrate 10 from possible damage from subsequent etching and polishing steps.

Figure 5:
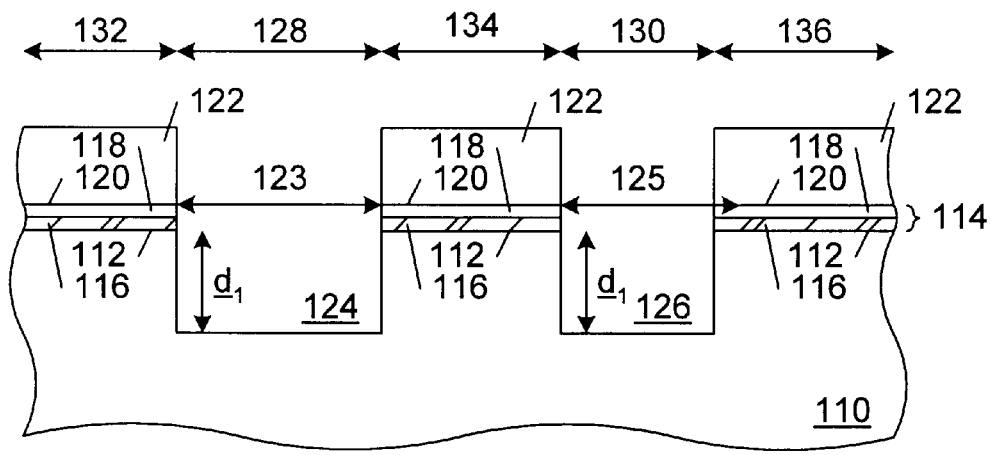
FIG. 5 is a partial cross-sectional view of a semiconductor topography according to a processing step subsequent to FIG. 4 in which shallow trenches are etched into the semiconductor substrate.

Referring now to FIG. 5, photoresist layer 122 is deposited upon upper surface 120 of polish-stop layer 114. Photoresist layer 122 is then selectively exposed to a form of radiation, such as ultraviolet light, electrons, or x-rays. An exposure tool and mask, or data tape in electron beam lithography, are used to effect the desired selective exposure. After the subsequent development step, areas 123 and 125 are exposed. Shallow trenches 124 and 126 are then formed, preferably by using a chlorinated anisotropic plasma etch. Shallow trenches 124 and 126 define field regions 128 and 130 of semiconductor substrate 110. Field regions 128 and 130 are used to electrically isolate active regions 132, 134, and 136 of semiconductor substrate 110 from one another. Trench floors of shallow trenches 124 and 126 are located a depth $d_1$ below upper surface 112 of semiconductor substrate 110. The remaining portion of photoresist layer 122 is subsequently removed. Depending on the type of the photoresist used, an organic stripper, preferably phenol-free, may be used to remove the photoresist. An inorganic stripper like sulfuric acid with hydrogen peroxide or ammonium persulfate may also be used.

Figure 6:
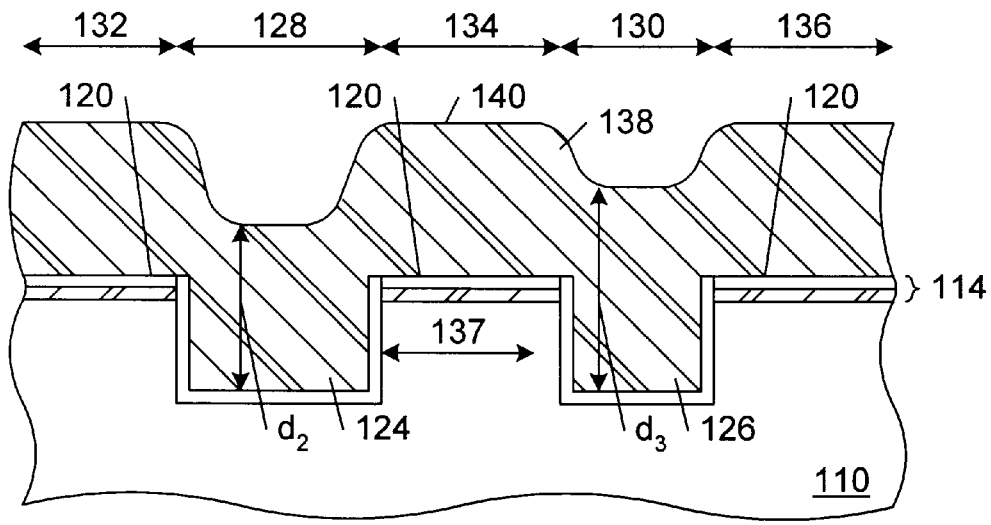
FIG. 6 is a partial cross-sectional view of a semiconductor topography according to a processing step subsequent to FIG. 5 in which a thin thermal oxide is grown and then a trench dielectric is deposited upon the semiconductor substrate and into the shallow trenches.

Turning now to FIG. 6, thin thermal oxide 137 is first grown upon the trench floor and the trench sidewalls of both trench 124 and trench 126. Trench dielectric 138 is then deposited upon the semiconductor topography. In a preferred embodiment, trench dielectric 138 comprises TEOS formed using chemical-vapor deposition at a temperature of approximately 400–600° C. Upper surface 140 of trench dielectric 138 conforms to the underlying contour defined by shallow trenches 124 and 126. As a result, upper surface 140 is lower in field regions 128 and 130 compared to upper surface 140 in active regions 132, 134, and 136. Furthermore, upper surface 140 in field region 128 (above shallow trench 124) is at a distance $d_2$ above the trench floor and upper surface 140 in field region 130 (above shallow trench 125) is at a distance $d_3$ above the trench floor. Distance $d_3$ is greater than distance $d_2$ and both $d_2$ and $d_3$ are greater than the depth $d_1$ of trench 124 and trench 126. Shallow trench 124 is easier to fill than shallow trench 126 since shallow trench 124 is wider and has a smaller aspect ratio (the ratio of depth to width). This additional level of upper surface 140 further increases the difficulty of obtaining a planar upper surface.

Figure 7:
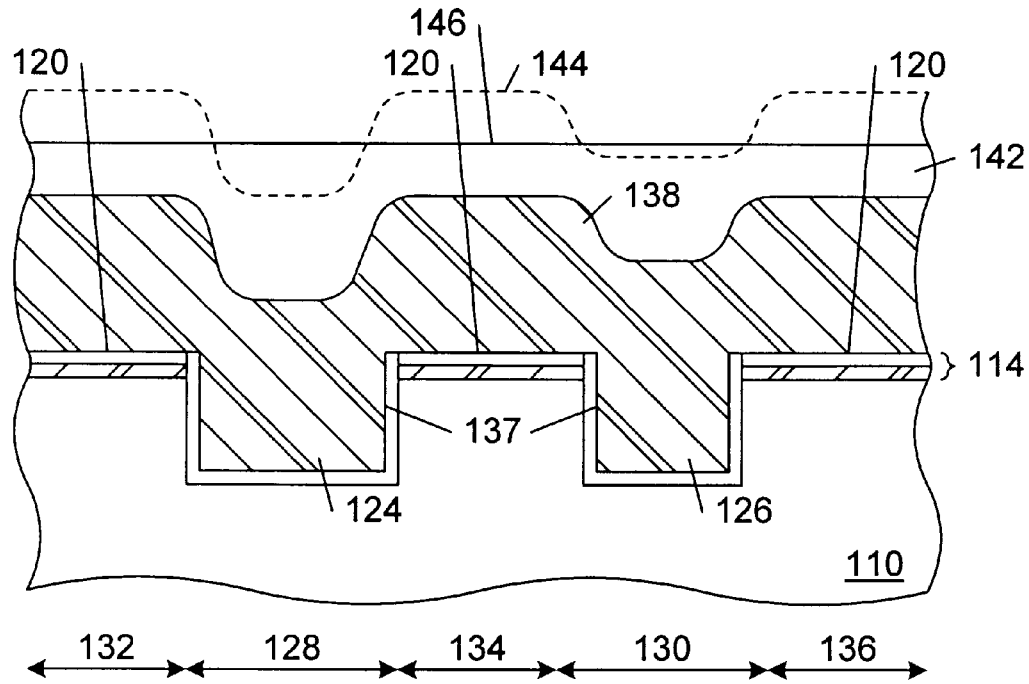
FIG. 7 is a partial cross-sectional view of a semiconductor topography according to a processing step subsequent to FIG. 6 in which a sacrificial dielectric is deposited upon the trench dielectric and heated to reflow and become planar.

Referring now to FIG. 7, sacrificial dielectric 142 is deposited upon the semiconductor topography. In a preferred embodiment, sacrificial dielectric 142 comprises a hydrogen silsesquioxane-based flowable oxide ("HSQ") which is deposited in fluid-form using a spin-on technique. HSQ has the general composition $(H_2Si_2O_3)_n$, where n is a number from 3 to 8. It has been shown that HSQ can fill gaps better than other spin-on dielectrics which makes it an ideal candidate for semiconductor circuits with critical dimensions less than 0.35 μm. HSQ can fill even irregularly shaped gaps with minimum dimensions of approximately 0.08 μm and aspect ratios greater than 14. In addition, depending on the temperature used to cure the dielectric, the dielectric constant can be controlled to be anywhere in the range 2.9 to 3.1. After initial deposition, HSQ layer 142 conforms to the underlying contour defined by trench dielectric 138. HSQ layer 142 is then heated at a temperature of approximately 400–1000° C. to reflow. As a result HSQ layer 142 flows to give rise to a substantially planar upper surface. It is postulated that by adjusting the temperature during conversion, the HSQ layer can be densified sufficiently such that it has polish characteristics which are close to the polish characteristics of underlying trench dielectric 138. Due to heating and densification, the HSQ layer becomes very hygroscopic. Since the HSQ layer is proximal to the active regions of the substrate, where devices will be formed, it is essential to assure complete removal of the layer during subsequent processing. Water moisture can be catastrophic to device performance.

Figure 8:
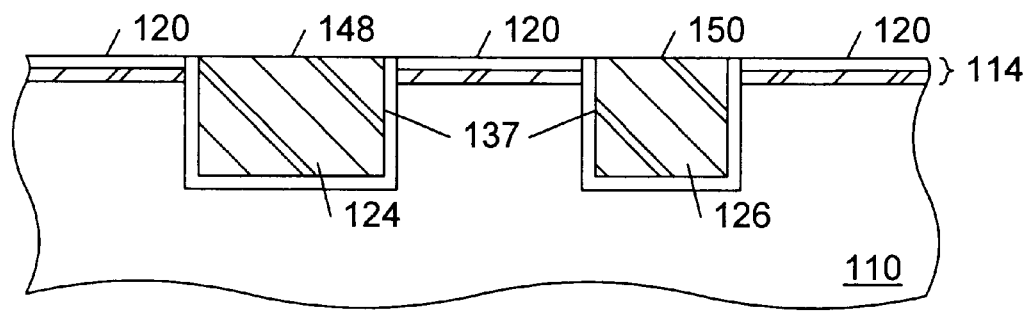
FIG. 8 is a partial cross-sectional view of a semiconductor topography according to a processing step subsequent to FIG. 7 in which a chemical-mechanical polish is used to remove the entire sacrificial dielectric layer and a portion of the trench dielectric layer external to the shallow trenches.

Turning now to FIG. 8, sacrificial dielectric layer 142 is entirely removed together with a portion of trench dielectric layer 138. In a preferred embodiment, a chemical-mechanical polishing ("CMP") process is used to remove the dielectric layers across the topography and specifically in the trench area commensurate with the nitride surface adjacent the trench. In an alternative embodiment, etchback may be used in addition to the CMP to provide improved planarization. To prevent mechanical work damage on the polished layer, the chemical component of the polishing should dominate. The polishing stops when upper surface 148 and 150 of the trench dielectric is at the same level as upper surface 120 of polish-stop layer 114. In a preferred embodiment, polish-stop layer 114 comprises nitride which has dissimilar polish characteristics compared to the trench dielectric and is thus used for end-point detection. Sacrificial dielectric layer 142 and trench dielectric 138 have similar polish characteristics and thus polish at approximately the same rate. A substantially planar surface results with an upper surface at the same level as the upper surface of polish-stop layer 114.

Figure 9:
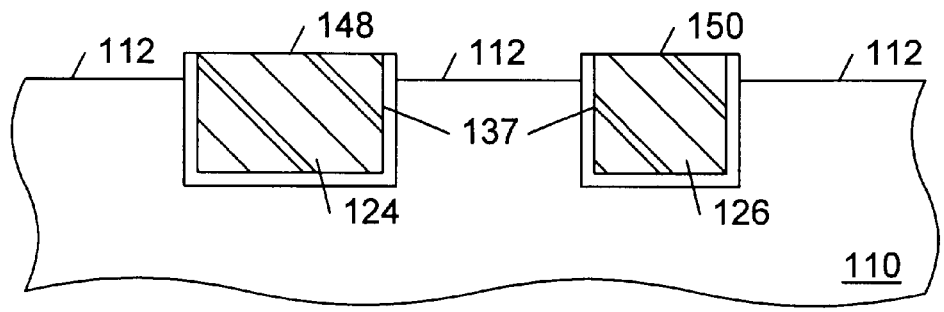
FIG. 9 is a partial cross-sectional view of a semiconductor topography according to a processing step subsequent to FIG. 8 in which the polish-stop layer has been removed and the upper surface of the trench dielectric is above the upper surface of the semiconductor substrate.

Turning now to FIG. 9, polish-stop layer 114 is removed. A wet etch is preferably used and an etchant which has high selectivity towards the polish-stop layer 114 and high selectivity against the trench dielectric and substrate. In an embodiment where the polish-stop layer comprises nitride, the etching can be performed by reflux boiling 85% phosphoric acid at approximately 180° C. Upper surfaces 148 and 150 are now above upper surface 112 of semiconductor substrate 110. The trench dielectric extends above the silicon surface which protects the corners of shallow trenches 124 and 126 from any subsequent cleaning. Any damage to the corner of the shallow trenches may degrade the isolation capabilities of the shallow trenches. The width of the active areas may be decreased beyond acceptable design levels which may give rise to undesirable narrow-width effects. In addition, during subsequent silicide formation, silicide may form along the exposed upper portion of the trench sidewalls and cause undesirable electrical shorts between the source/drain contact and the semiconductor substrate.

It will be appreciated to those skilled in the art having the benefit of this disclosure that this invention is believed to be capable of forming a planar surface for trench dielectrics using an improved method utilizing a flowable oxide. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for forming an isolation structure within a semiconductor substrate, comprising:

forming a polish-stop layer upon said semiconductor substrate;

etching a shallow trench into said semiconductor substrate;

thermally growing a thin layer of oxide upon a trench floor and upon trench sidewalls;

forming a trench dielectric layer into said trench and upon said polish-stop layer, wherein an upper surface of said trench dielectric layer conforms to an underlying contour of said trench, and wherein the upper surface of the trench dielectric is everywhere above an upper surface of said semiconductor substrate;

forming a sacrificial dielectric layer upon said trench dielectric layer, wherein the step of forming said sacrificial dielectric comprises spin-on depositing hydrogen silsesquioxane-based flowable oxide, wherein an upper surface of said flowable oxide conforms to the underlying contour of said trench dielectric; and reflowing said flowable oxide at a temperature of approximately 400–1000° C., wherein an upper surface of said flowable oxide is substantially planar; and removing the entirety of said sacrificial layer and a portion of said trench dielectric, wherein an upper surface of said trench dielectric layer after partial removal is at the same level as an upper surface of said polish-stop layer.

2. The method as recited in claim 1, wherein the step of forming a polish-stop layer comprises forming a polish-stop layer, wherein said polish-stop layer comprises:

thermally growing an oxide layer upon said semiconductor substrate; and depositing a nitride layer upon said thermally grown oxide.

3. The method as recited in claim 1, wherein the step of forming said shallow trench comprises:

depositing a photoresist layer upon said polish-stop layer;
   exposing a portion of said photoresist layer using a mask;
   removing exposed portion of said photoresist to expose an upper surface of said semiconductor substrate; and
   anisotropically etching a trench void into said semiconductor substrate.

4. The method as recited in claim 1, wherein the step of depositing said trench dielectric comprises a CVD oxide from a TEOS source.

5. The method as recited in claim 1, wherein the step of depositing said sacrificial dielectric comprises:

spin-on depositing hydrogen silsesquioxane-based flowable oxide, wherein an upper surface of said flowable oxide conforms to the underlying contour of said trench dielectric; and reflowing said flowable oxide at a temperature of approximately 400–1000° C., wherein the upper surface of said flowable oxide is substantially planar.

6. The method as recited in claim 1, wherein the step of entirely removing said sacrificial layer and partially removing said trench dielectric comprises chemical-mechanical polishing.

7. A method for forming an isolation structure within a silicon substrate, comprising:

forming a polish-stop layer, comprising a nitride layer upon said silicon substrate;

forming at least two shallow trenches into said silicon substrate, wherein said shallow trenches comprise large-width shallow trenches and small-width shallow trenches;

thermally growing a thin layer of oxide upon a trench floor and upon trench sidewalls;

depositing a trench dielectric into said shallow trench and upon said polish-stop layer, wherein an upper surface of said trench dielectric layer conforms to an underlying contour of said shallow trenches, wherein the upper surface of said trench dielectric is higher above said small-width shallow trenches compared to the upper surface of said trench dielectric above said large-width shallow trenches, and wherein the upper surface of said trench dielectric is everywhere above an upper surface of said silicon substrate;

spin-on depositing a hydrogen silsesquioxane-based flowable oxide layer and subsequently reflowing said flowable oxide by applying heat, wherein an upper surface of said flowable oxide is substantially planar;

polishing and entirely removing said flowable oxide layer and a portion of said trench dielectric exterior to said shallow trenches, wherein an upper surface of said trench dielectric layer after partial removal is at the same level as an upper surface of said polish-stop layer.

8. The method as recited in claim 7, wherein the step of forming said shallow trenches comprises:

depositing a photoresist layer upon said polish-stop layer;
   exposing portions of said photoresist layer using a mask;
   removing exposed portions of said photoresist to expose portions of the upper surface of said silicon substrate; and
   anisotropically etching a trench voids into said silicon substrate.

9. The method as recited in claim 7, wherein the step of depositing said trench dielectric comprises a CVD oxide from a TEOS source.

10. The method as recited in claim 1, wherein said reflowing said flowable oxide comprises selecting a temperature such that the sacrificial dielectric layer has a polishing rate the same as a polishing rate of the trench dielectric.

11. The method as recited in claim 7, wherein said reflowing said flowable oxide comprises selecting a temperature such that the sacrificial dielectric layer has a polishing rate the same as a polishing rate of the trench dielectric.

* * * * *